(12) United States Patent
Higashijima

(10) Patent No.: US 8,298,344 B2
(45) Date of Patent: Oct. 30, 2012

(54) METHOD OF PROCESSING WORKPIECES USING A VESSEL WITH A LOW PRESSURE SPACE SURROUNDING A PROCESSING SPACE FOR THE PURPOSE OF PREVENTING THE LEAKAGE OF ATMOSPHERE INTO THE PROCESSING SPACE

(75) Inventor: Jiro Higashijima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 475 days.

(21) Appl. No.: 12/439,249

(22) PCT Filed: Nov. 21, 2007

(86) PCT No.: PCT/JP2007/072540
§ 371 (c)(1),
(2), (4) Date: Feb. 27, 2009

(87) PCT Pub. No.: WO2008/062826
PCT Pub. Date: May 29, 2008

(65) Prior Publication Data
US 2009/0260656 A1     Oct. 22, 2009

(30) Foreign Application Priority Data

Nov. 24, 2006   (JP) ................................. 2006-317253

(51) Int. Cl.
*F16J 15/32* (2006.01)
*B08B 5/04* (2006.01)
(52) U.S. Cl. ......................................... 134/21; 277/309
(58) Field of Classification Search .................... 134/21; 277/309
See application file for complete search history.

(56) References Cited

U.S. PATENT DOCUMENTS 5,248,022 A   9/1993   Kamikawa et al.
(Continued)

FOREIGN PATENT DOCUMENTS

JP          4-196532        7/1992
(Continued)

OTHER PUBLICATIONS

International Search Report.
(Continued)

*Primary Examiner* — Michael Barr
*Assistant Examiner* — Caitlin N Dunlap
(74) *Attorney, Agent, or Firm* — Smith, Gambrell & Russell, LLP

(57) ABSTRACT

A lid 81 included in a processing vessel 30 is held by a simple mechanism to prevent the leakage of an atmosphere in a processing space 83 formed in the processing vessel 30 into an environmental space. A low-pressure space 84 surrounds the processing space 83 formed in the processing vessel 30. The processing vessel 30 is provided with a first sealing member 101 sealing a joint between a part of a vessel body 80 and a part of the lid 81 to separate the low-pressure apace 84 from the processing space 83, and a second sealing member 102 sealing a joint between a part of the vessel body 80 and a part of the lid 81 on the outer side of the first sealing member 101 to separate the low-pressure space from an external space surrounding the processing vessel 30. Pressure in the low-pressure space 84 is adjusted such that pressure in the processing space 83 is equal to or lower than pressure in the external space outside the processing vessel 30 in an internal leakage state where the first sealing member 101 permits leakage and the second sealing member 102 is in a sealing condition.

6 Claims, 8 Drawing Sheets

U.S. PATENT DOCUMENTS

| | | | | |
|---|---|---|---|---|
| 5,368,648 | A | * | 11/1994 | Sekizuka ..................... 118/733 |
| 5,820,692 | A | * | 10/1998 | Baecker et al. ................. 134/21 |
| 6,431,948 | B1 | | 8/2002 | Atoh |
| 2002/0073576 | A1 | | 6/2002 | Kamikawa et al. |
| 2002/0132480 | A1 | * | 9/2002 | Shindo et al. ................. 438/689 |
| 2003/0170949 | A1 | | 9/2003 | Chouno et al. |

FOREIGN PATENT DOCUMENTS

| | | |
|---|---|---|
| JP | 9-10709 | 1/1997 |
| JP | 11-204613 | 7/1999 |
| JP | 11-219925 | 8/1999 |
| JP | 2000-349060 | 12/2000 |
| JP | 2002-246361 | 8/2002 |
| JP | 2003-224102 | 8/2003 |
| JP | 2003-332322 | 11/2003 |
| JP | 2004-134525 | 4/2004 |

OTHER PUBLICATIONS

Korean office Action mailed on Dec. 24, 2009 for priority Korean Application No. 10-2008-701689 with English translation.

"Regarding duty to disclose information to the USPTO" dated Jan. 22, 2010.

PCT Second and Supplementary Notice Informing the Applicant of the Communication of the International Application (Form PCT/IB/308) dated Jan. 2004.

PCT Notification of Transmittal of Translation of the International Preliminary Examination Report (Form PCT/IB/338) dated Jan. 2004.

PCT International Preliminary Report on Patentability (Form PCT/IB/373) dated Jan. 2004.

Japanese Office Action issued on Oct. 4, 2011 for Application No. 2006-317253 with English translation.

* cited by examiner

METHOD OF PROCESSING WORKPIECES USING A VESSEL WITH A LOW PRESSURE SPACE SURROUNDING A PROCESSING SPACE FOR THE PURPOSE OF PREVENTING THE LEAKAGE OF ATMOSPHERE INTO THE PROCESSING SPACE

TECHNICAL FIELD

The present invention relates to a processing system and a processing method for processing a workpiece, such as a semiconductor wafer or a glass substrate for a LCD, and a recording medium storing instructions for the processing method to execute.

BACKGROUND ART

For example, a semiconductor device manufacturing process includes a resist removing process for removing a resist coating a surface of a semiconductor wafer (hereinafter, referred to simply as "wafer"). Resist removing processes disclosed in JP 2004-134525 A, JP 2003-332322 A and JP 2003-224102 A supply a mixed gas of ozone gas and steam into a processing vessel defining a processing space in which the wafer is placed to make the resist water-soluble by oxidizing the resist by the mixed gas, and removes the water-soluble resist with pure water.

A known processing system for carrying out such a process includes a processing vessel including a vessel body having an upper wall provided with an opening, and a lid covering the opening from above. The lid is lifted up to open the opening of the processing vessel, and then a workpiece is put into the processing vessel through the opening. The lower surface of a peripheral part of the lid is put into close contact with an edge part of the vessel body defining the opening to form a sealed processing space.

The lid is supported from above by a lid moving mechanism, such as a cylinder mechanism, and the lid is moved vertically relative to the vessel body by operating the lid moving mechanism (JP 2003-332322 A). The lid moving mechanism applies pressure to the lid to set the lid surely in close contact with the vessel body.

A locking mechanism for locking the lid in place proposed, for example, in JP 2003-332322 A is provided with plural rollers. This locking mechanism holds a peripheral part of the lid covering the opening and the edge part of the vessel body between plural upper rollers and plural lower rollers. Thus the lid is fixed in place to keep the lid in close contact with the vessel body.

A sealing member, such as an O ring, is placed on the upper surface of a peripheral part of the vessel body to seal a joint between the lower surface of the peripheral part of the lid and the vessel body. Construction proposed in JP 2003-224102 A places two sealing members, namely, an inner and an outer sealing member, on the upper surface of the peripheral part of the vessel body, and connects an exhaust line to a space between the inner and the outer sealing member to evacuate the space between the sealing members so that the close adhesion of the sealing members may be improved.

DISCLOSURE OF THE INVENTION

Problem to be Solved by the Invention

The construction and operations of the foregoing locking mechanism are complicated and the positional adjustment of the rollers is difficult. However, it is difficult to hold the lid only by the operation of the lid moving mechanism without using the locking mechanism. For example, since the processing space is set at a positive pressure relative to the external pressure for the process mentioned above using ozone gas and steam, force acts on the lid to separate the lid from the vessel body and the sealing member is liable to be deformed. Consequently, it is possible that a gap is formed between the lid and the vessel body, and the internal atmosphere of the processing space leaks outside, which is dangerous. If the system malfunctions and the pressure exerted by the lid moving mechanism drops, it is possible that the lid is separated from the vessel body and the atmosphere in the processing space leaks out unless the processing system is provided with the locking mechanism.

The present invention has been made in view of the foregoing problems and it is therefore an object of the present invention to provide a processing system having a processing vessel and a lid, and capable of preventing the leakage of an atmosphere in a processing space from the processing vessel by holding the lid of the processing vessel by s simple mechanism, a processing method, and a recording medium.

Means for Solving the Problem

The present invention provides a processing system including: a processing vessel having a vessel body defining a processing space for receiving a workpiece and processing the same therein, and a lid for covering an opening formed in the vessel body to seal the processing space, the processing space being surrounded by a low-pressure space set at a pressure lower than that of the processing space; a first sealing member sealing a joint between a part of the vessel body and a part of the lid to separate the low-pressure apace from the processing space; a second sealing member sealing a joint between a [art of the vessel body and a part of the lid on the outer side of the first sealing member to separate the low-pressure space from an external space surrounding the processing vessel; and a low-pressure space pressure adjusting mechanism for adjusting pressure in the low-pressure space; wherein the low-pressure space pressure adjusting mechanism adjusts pressure in the low-pressure space such that pressure in the processing space is equal to or lower than pressure in a space outside the processing vessel in an internal leakage state where the first sealing member permits leakage and the second sealing member is in a sealing condition.

The low-pressure space pressure adjusting mechanism may adjust the pressure in the low-pressure space in the internal leakage state such that the pressure in the processing space is lower than the pressure in the space outside the processing vessel. The pressure in the processing space may be higher than the pressure in the space outside the processing vessel when both the first and the second sealing member are in a normal sealing condition. The first sealing member may have heat resistance and corrosion resistance to an atmosphere in the processing space higher than those of the second sealing member. The second sealing member may have a sealing ability higher than that of the first sealing member.

The first sealing member may be formed of a fluorocarbon resin. A first contact surface with which the first sealing member comes into contact may be formed of a silicon carbide. The second sealing member may be a lip packing.

The vessel body may include a base, and an attachment detachably attached to the base, and the first sealing member, a supply port through which a processing fluid is supplied into the processing space and an exhaust port through which the processing fluid is discharged from the processing space may be formed in the body mounting member.

The low-pressure space may have a volume not smaller than that of the processing space. The processing system may further include a lid moving mechanism for moving the lid relative to the vessel body, and the lid moving mechanism may press the lid covering the opening against the vessel body.

The processing fluid to be supplied into the processing space may be ozone, steam or a mixed fluid of ozone and steam.

The present invention provides a processing method of processing a workpiece placed in a processing space defined by a processing vessel including the steps of: carrying a workpiece through an opening formed in a vessel body of the processing vessel into the vessel body; covering the opening by a lid of the processing vessel to close the processing space, forming a low-pressure space of a pressure lower than that in the processing space on the outer side of the processing space, and creating a normally sealed state where a space outside the processing vessel, the low-pressure space and the processing space are isolated from each other; and evacuating the low-pressure space at a pressure such that pressure in the processing vessel is not higher than pressure in the space outside the processing vessel in an internal leakage state where the processing space and the low-pressure space isolated from the space outside the processing vessel communicate with each other, and processing the workpiece placed in the processing space.

The processing method may process the workpiece placed in the processing space with the pressure in the low-pressure space adjusted such that the pressure in the processing space is lower than the pressure in a space outside the processing vessel in the internal leakage state. The workpiece placed in the processing space may be processed after adjusting the pressure in the processing space to a pressure higher than the pressure in a space outside the processing vessel in a normally sealed state. The workpiece placed in the processing space may be processed after adjusting the pressure in the processing space to a pressure higher than the pressure in a space outside the processing vessel in a normally sealed state. The workpiece placed in the processing space may be processed with the lid covering the opening is pressed against the vessel body. The workpiece placed in the processing space may be processed by using ozone, steam or a mixed fluid of ozone and steam supplied into the processing space.

The present invention provides a recording medium storing a program for a computer for controlling a processing system to execute to control the processing system to carry out the foregoing processing method.

According to the present invention, the pressure in the processing space in the internal leakage state where the first sealing member permits leakage is adjusted to a pressure not higher than the pressure in a space outside the processing vessel to prevent the further separation of the lid from the vessel body and thereby leakage through a joint sealed by the second sealing member can be prevented. Thus, even if leakage through the joint sealed by the first sealing member occurs, the leakage of the atmosphere in the processing space from the processing vessel can be prevented. The lid can be surely held and can be prevented from opening by the simple mechanism without using a complicated mechanism, such as the conventional locking mechanism. Difficult adjustment is unnecessary and the cost of the system can be reduced.

BEST MODE FOR CARRYING OUT THE INVENTION

Figure 1:
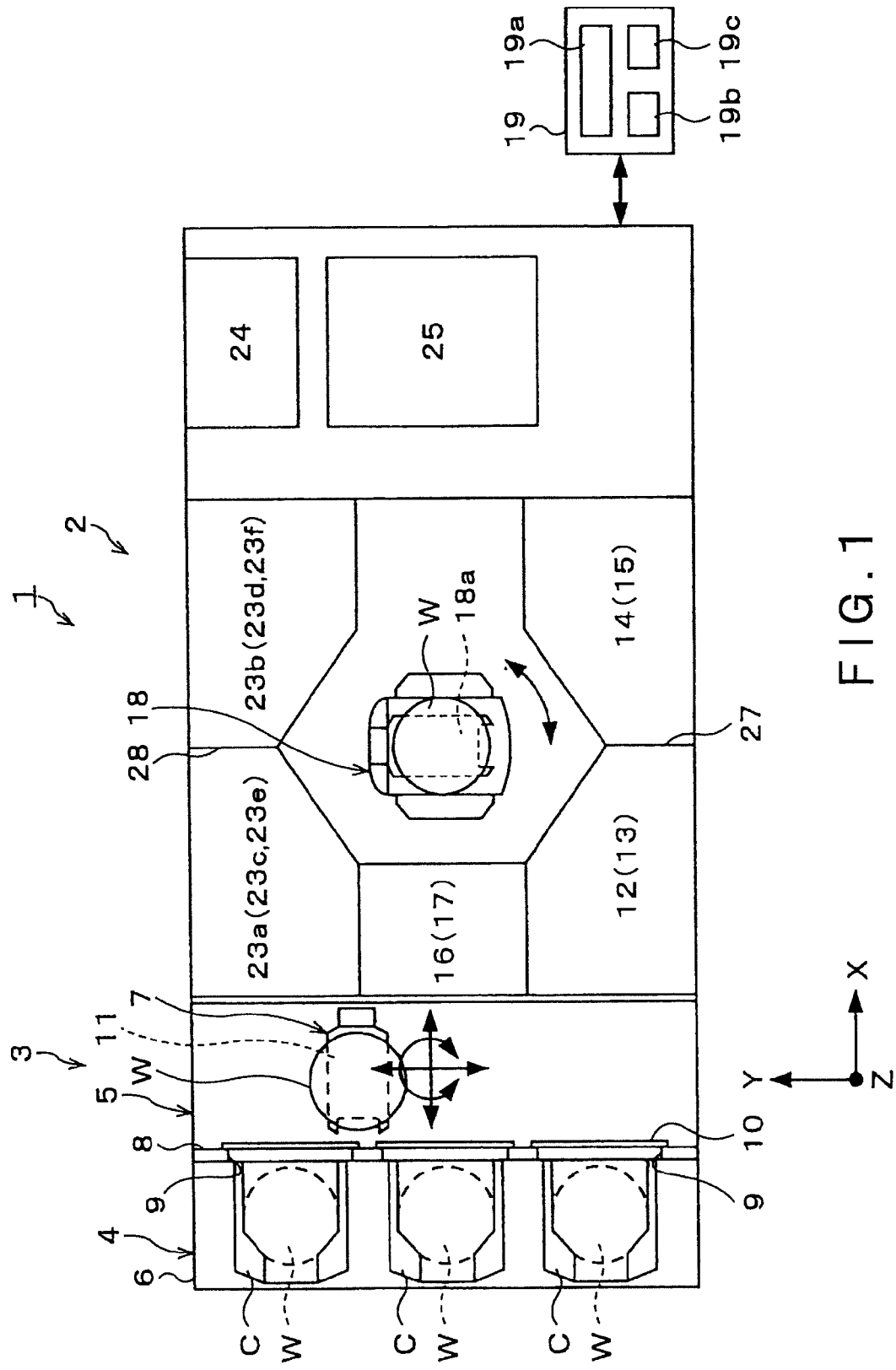
FIG. 1 is a plan view of a processing system.
Figure 2:
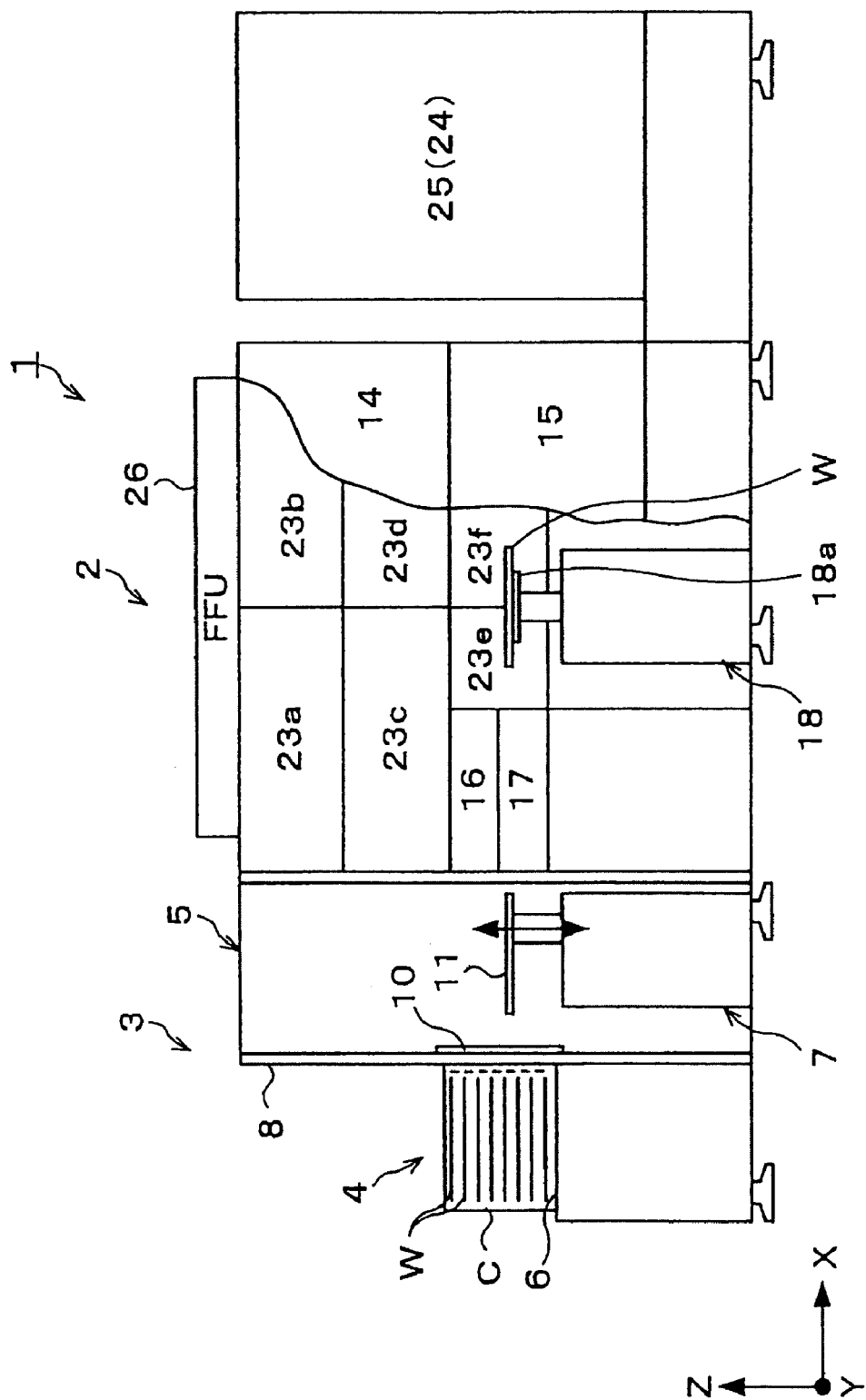
FIG. 2 is a side elevation of the processing system.

A preferred embodiment of the present invention will be described in terms of a processing system 1 that removes a resist coating a surface of a wafer, namely, an example of a workpiece, by making the resist water-soluble. FIG. 1 is a plan view of the processing system 1 and FIG. 2 is a side elevation of the processing system 1. In the specification and the accompanying drawings, components having substantially the same functional construction are designated by the same reference characters and the duplicate description thereof will be omitted.

The processing system 1 has a processing block 2 for processing a wafer W by a resist water-solubilizing process and a cleaning process, a transfer block 3 for transferring a wafer W to and receiving a wafer W from the processing block 2, and a control computer 19 that gives commands to functional parts of the processing system 1. In FIGS. 1 and 2 it is defined for the convenience of description that a direction along the width of the transfer unit 3 is a Y direction, a direction in which the processing unit and the transfer unit 3 are arranged, namely, a direction perpendicular to the Y direction, is an X direction, and a vertical direction is a Z direction.

The transfer block 3 has an inlet-outlet port 4 provided with a table 6 for supporting containers each capable of containing, for example, twenty-five substantially disk-shaped wafers W at predetermined intervals in a substantially horizontal position, namely, carriers C, and a wafer transfer unit 5 provided with a wafer carrying device 7 for transferring a wafer W between the carrier C supported on the table 6 and the processing block 2.

A wafer W is taken out from and is put into the carrier C through an open side of the carrier C. The open side of the carrier C is covered with a removable lid. The carrier C is provided with shelves for supporting wafers W thereon at predetermined intervals. The shelves are attached to the inside surfaces of the walls of the carrier C so as to define twenty-five slots for receiving wafers W therein. One wafer W is placed in each of the slots in a horizontal position with its surface in which semiconductor devices are to be formed, namely, an upper surface, facing up.

The table 6 of the inlet-outlet port 4 can support, for example, three carriers C on its horizontal surface in an arrangement along the Y direction. A carrier C is placed on the table 6 with its open side covered with the lid facing a boundary wall 8 between the inlet-outlet port 4 and the wafer transfer unit 5. The boundary wall 8 is provided with windows 9 respectively corresponding to positions where carriers C are placed on the table 6. Window opening and closing mechanisms 10 each provided with a shutter or the like for closing the window 9 are disposed so as to correspond to the windows 9, respectively, on a side surface of the boundary wall 8 on the side of the wafer transfer unit 5.

The window opening and closing mechanisms 10 can be opened and closed, as well as the lid of the carrier C. Each of the windows 9 and the lid of a carrier C can be simultaneously opened and closed. When the window 9 is opened to connect the open side of the carrier C to the wafer transfer unit 5, the carrying device 7 of the wafer transfer unit 5 can access the carrier C and can carry a wafer W.

The wafer carrying device 7 installed in the wafer transfer unit 5 can move in directions parallel to the Y and the Z axis and can turn about an axis parallel to the Z direction. The wafer carrying device 7 has a transfer arm 11 capable of gripping a wafer W. The transfer arm 11 can move in directions parallel to the X direction. The wafer carrying device 7 can access the slot at a desired height in any one of all the carriers C placed on the table 6. The wafer carrying device 7 can access either of two transfer units 16 and 17 stacked one on top of the other in the processing block 2 to carry a wafer from the inlet-outlet port 4 to the processing block 2 and from the processing block to the inlet-outlet port 4.

The processing block 2 has a main wafer carrying device 18, namely, a carrying means, the two transfer units 16 and 17 for temporarily holding a wafer W received from and to be transferred to the wafer transfer unit 5, four cleaning units 12, 13, 14 and 15, and six processing units 23a to 23f for making resist water-soluble.

Installed in the processing block 2 are a process gas generating unit 24, for generating process fluids to be supplied to the processing units 23a to 23f, including an ozone generator 40, which will be described later, for generating ozone and a steam generator 41, which will be described later, for generating steam, and a chemical solution storage unit 25 for storing predetermined process solutions to be supplied to the cleaning units 12, 13, 14 and 15. A filter fan unit (FFU) 26 is installed on the ceiling of the processing block 2. The FFU 26 supplies clean air to the units and the main wafer carrying device 18.

The transfer units 16 and 17 temporarily hold a wafer W received from and to be transferred to the wafer transfer unit 5. The transfer units 16 and 17 are stacked in two layers. The lower transfer unit 17 can be used for transferring a wafer W from the inlet-outlet port 4 to the processing block 2. The upper transfer unit 16 can be used for transferring a wafer W from the processing block 2 to the inlet-outlet port 4.

The main wafer carrying device 18 can move in directions parallel to the X and the Z direction and can turn about a vertical axis parallel to the Z direction. The main wafer carrying device 18 is provided with a carrying arm 18a for gripping a wafer W. the carrying arm 18a is slidable in directions parallel to the Y direction. Thus, the wafer carrying device 18 can access the wafer transfer units 16 and 17, the cleaning units 12 to 15, and the processing units 23a to 23f.

The cleaning units 12, 13, 14 and 15 process wafers W respectively processed by a resist water-solubilizing process by the processing unit processing units 23a to 23f by a cleaning process and a drying process. The two cleaning units 12 and 13 are stacked in two layers, and the cleaning units 14 and 15 are stacked in two layers. As shown in FIG. 1, The two cleaning units 12 and 13, and the two cleaning units 14 and 15 are symmetrical with respect to a wall 27 at the boundary between the two cleaning units 12 and 13, and the two cleaning units 14 and 15 as shown in FIG. 1. The cleaning units 12, 13, 14 and 15 are substantially the same in construction except that the two cleaning units 12 and 13, and the two cleaning units 14 and 15 are symmetrical with respect to a vertical plane.

The processing units 23a to 23f process a wafer W by a resist water-solubilizing process for making the resist coating a surface of a wafer W water-soluble. The processing units 23a to 23f are stacked up in two columns each having three layers including the two processing units as shown in FIG. 2. The processing units 23e, 23c and 23a are stacked up in that order in a left column. The processing units 23f, 23d and 23b are stacked up in that order in a right column. The processing units 23a to 23f are substantially the same in construction except that the processing units 23a and 23b, the processing units 23c and 23d, and the processing units 233 and 23f are symmetrical, respectively, with respect to a wall 28 at the boundaries between the processing units 23a and 23b, between the processing units 23c and 23d, and between the processing units 233 and 23f as shown in FIG. 1.

Ozone and steam are supplied to the processing units 23a to 23f through piping systems of the substantially the same construction. Therefore, the processing unit 23a and the piping system for the processing unit 23a will be described by way of example.

Figure 3:
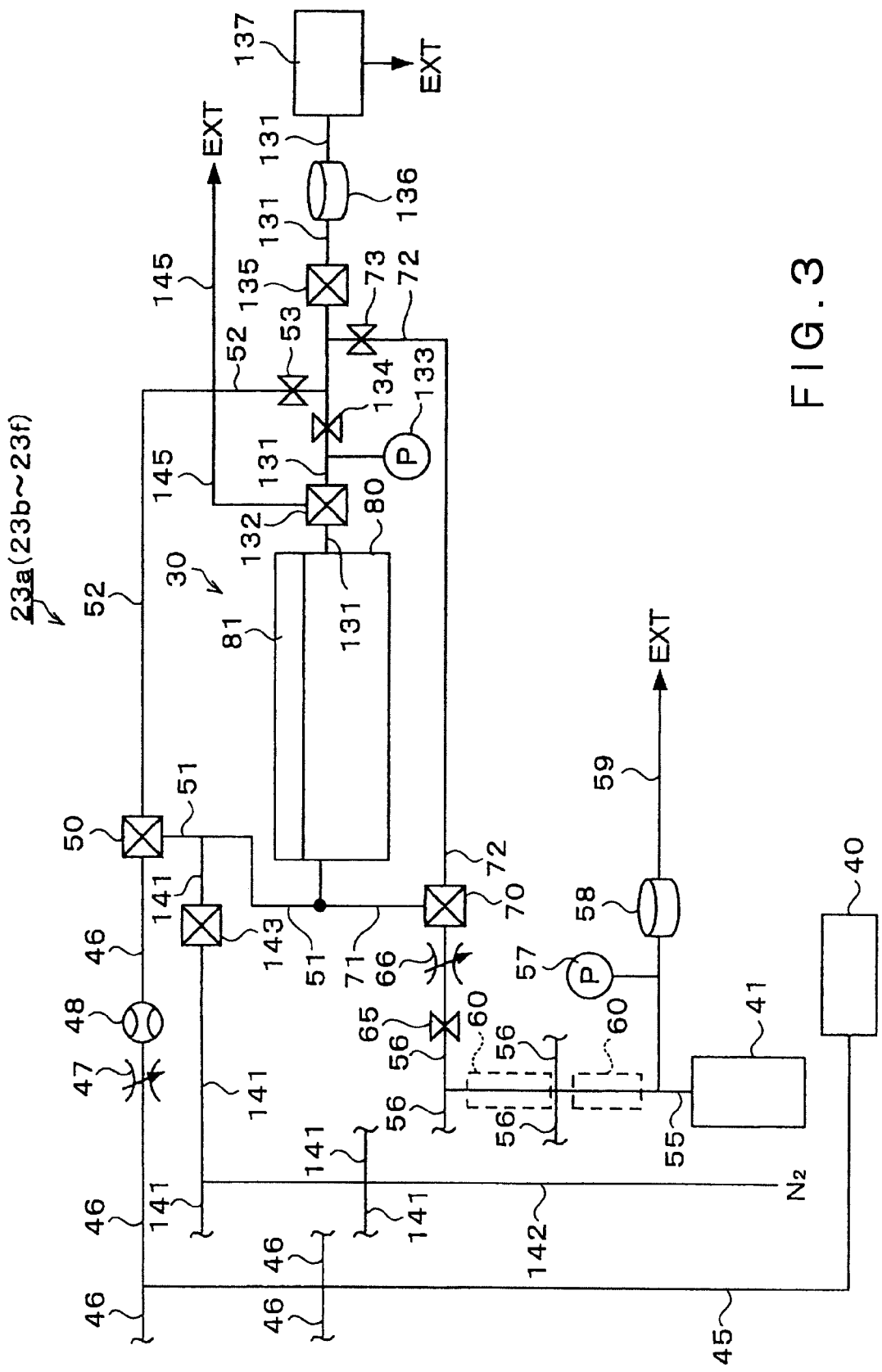
FIG. 3 is a diagrammatic illustration of a processing unit.

FIG. 3 shows the construction of the processing unit 23a. The processing unit 23a is provided with a processing vessel 30 in which a wafer w is processed. Ozone and steam, namely, process fluids, are supplied from the ozone generator 40 and the steam generator 41 of the process gas generating unit 24 into the processing vessel 30.

The ozone generator 40 produces ozone by the action of electrical discharge on an oxygen-containing gas. The ozone generator 40 supplies ozone to all the processing units 23a to 23f of the processing system 1. Branch ozone supply lines 46 branching off from a main ozone supply line 45 connected to the ozone generator 40 are connected to the processing units 23a to 23f, respectively. Each of the branch ozone supply lines 46 is provided with a needle valve 47 and a flow meter 48 to supply ozone generated by the ozone generator 40 into the processing vessel 30 of the processing unit 23a at a desired flow rate.

The downstream end of the branch ozone supply line 46 is connected through a selector valve 50 to an ozone supply line 51 for carrying ozone into the processing vessel 30 of the processing unit 23a, and a bypass ozone line 52 for carrying ozone around the processing vessel 30. The selector valve 50 is a three-way valve capable of selectively introducing ozone generated by the ozone generator 40 through the ozone supply line 51 into the processing vessel 30 or into the bypass ozone line 52 not connected to the processing vessel 30. The downstream end of the bypass ozone line 52 is connected through a check valve 53 for preventing the reverse flow of ozone to a discharge line 105, which will be described later.

The steam generator 41 generates steam by bringing pure water supplied thereto from an external pure water source to a boil. The steam generator 41 is common to all the processing units 23a to 23f of the processing system 1. Branch steam supply lines 56 branching off from a main steam supply line 55 connected to the steam generator 41 are connected to the processing units 23a to 23f, respectively.

A relief line 59 provided with a pressure switch 57 and a relief valve 58 is connected to the main steam supply line 55. When the pressure in the steam generator 41 exceeds a set value, part of steam is discharged through the relief line 59. Thus, the pressure of steam in the main steam supply line 55 is kept always at a set pressure. A pipe warming heater 60 is combined with the main steam supply line 55 to keep the main steam supply line at temperatures, for example, in the range of about 110° C. to about 120° C. to prevent the temperature of steam in the main steam supply line 55 from dropping.

The branch steam supply line 56 branching off from the main steam supply line 55 is provided with an orifice 65 and a needle valve 66. The orifice 65 and the needle valve 66 form a flow regulating mechanism for supplying steam generated by the steam generator 41 at a desired flow rate to the processing unit 23a.

The downstream end of the branch steam supply line 56 is connected through a selector valve 70 to a steam supply line 71 for carrying steam into the processing vessel 30, and a bypass steam line 72 for carrying steam around the processing vessel 30. The selector valve 70 is a three-way valve capable of selectively introducing steam generated by the steam generator 41 through the steam supply line 71 into the processing vessel 30 of the processing unit 23a or into the bypass steam line 72 not connected to the processing vessel 30.

Figure 4:
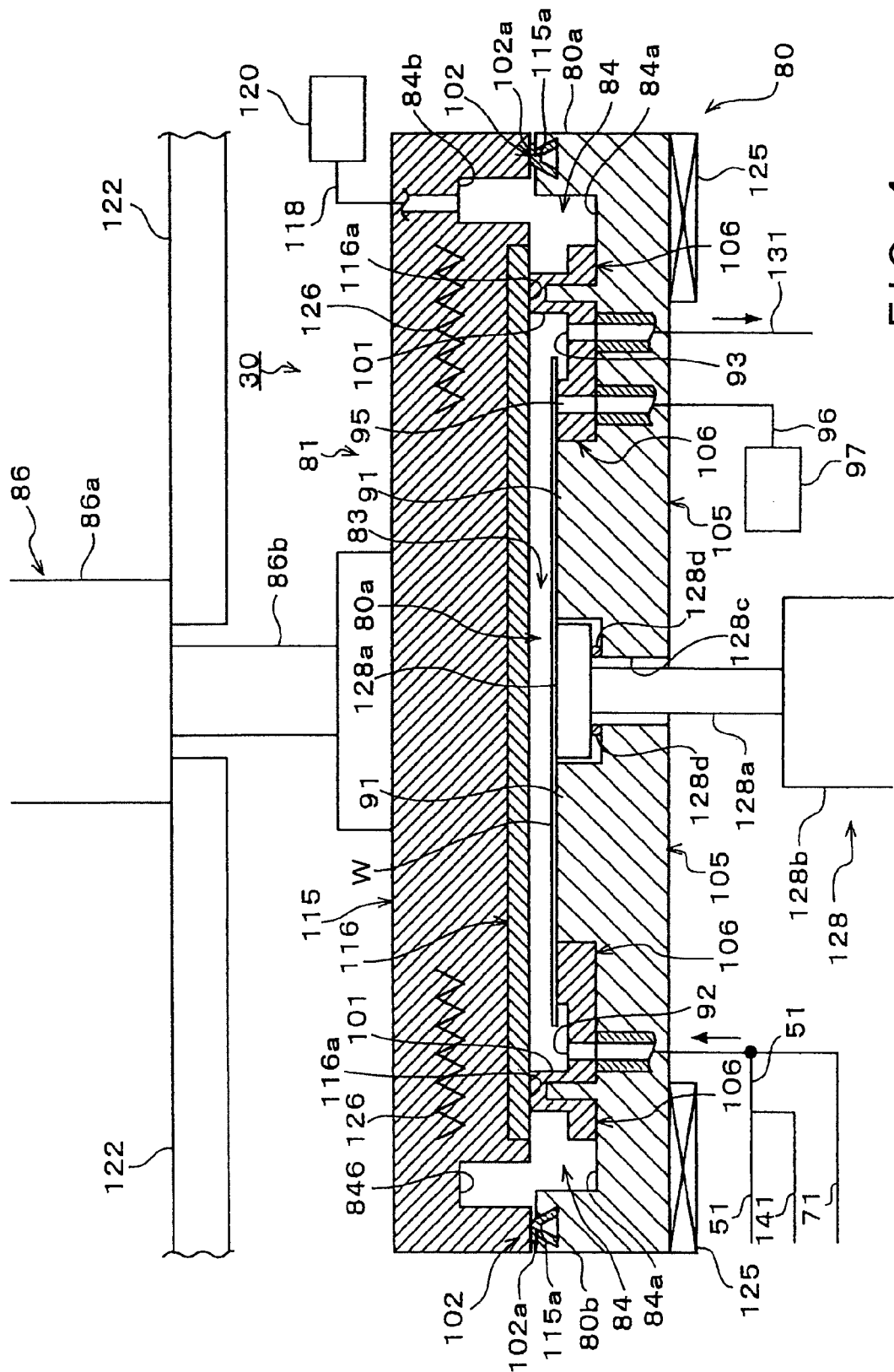
FIG. 4 is a schematic, longitudinal sectional view of a processing vessel, in which an opening is covered by a lid in a normal sealing state.
Figure 5:
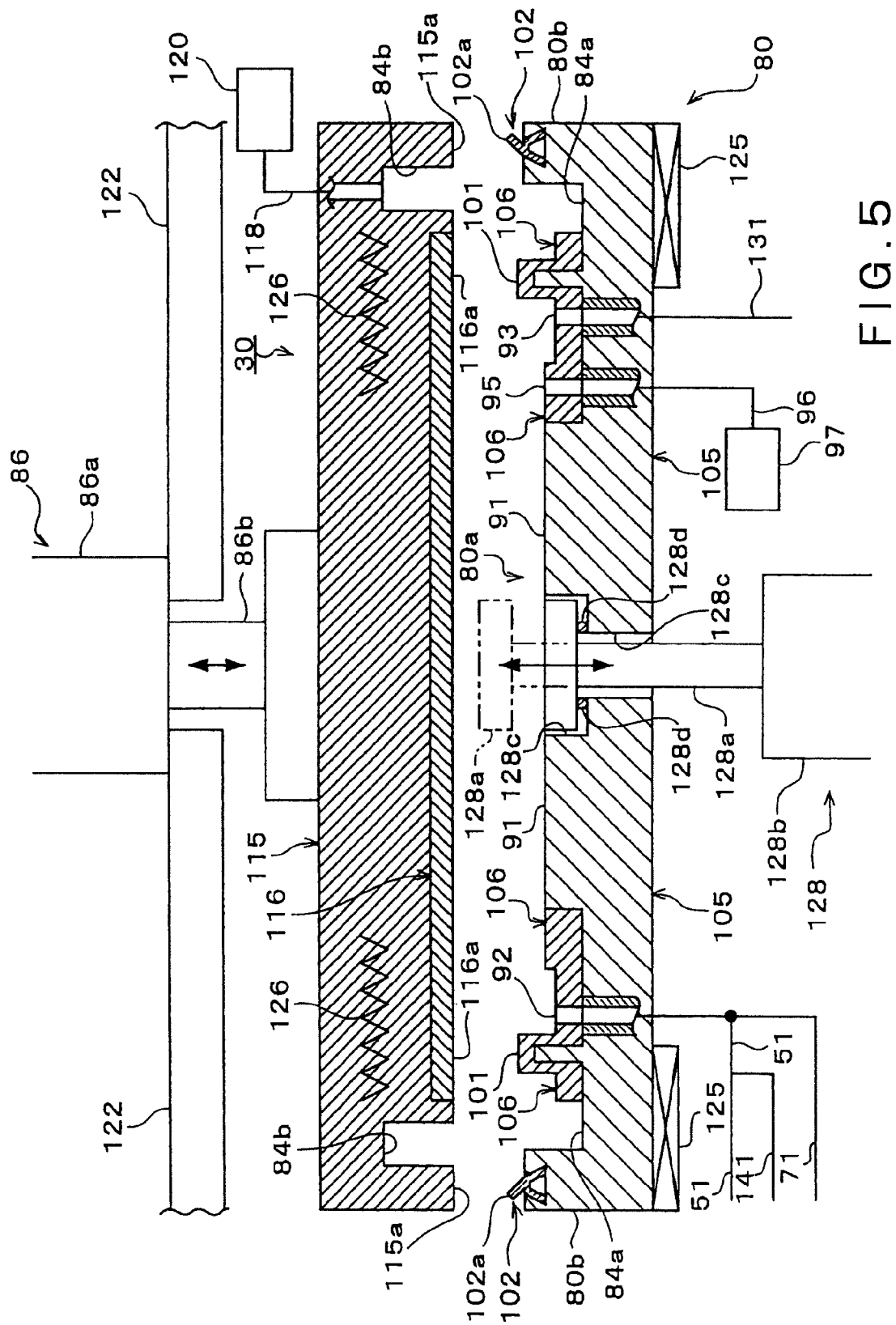
FIG. 5 is a schematic, longitudinal sectional view of the processing vessel, in which the opening is opened.
Figure 6:
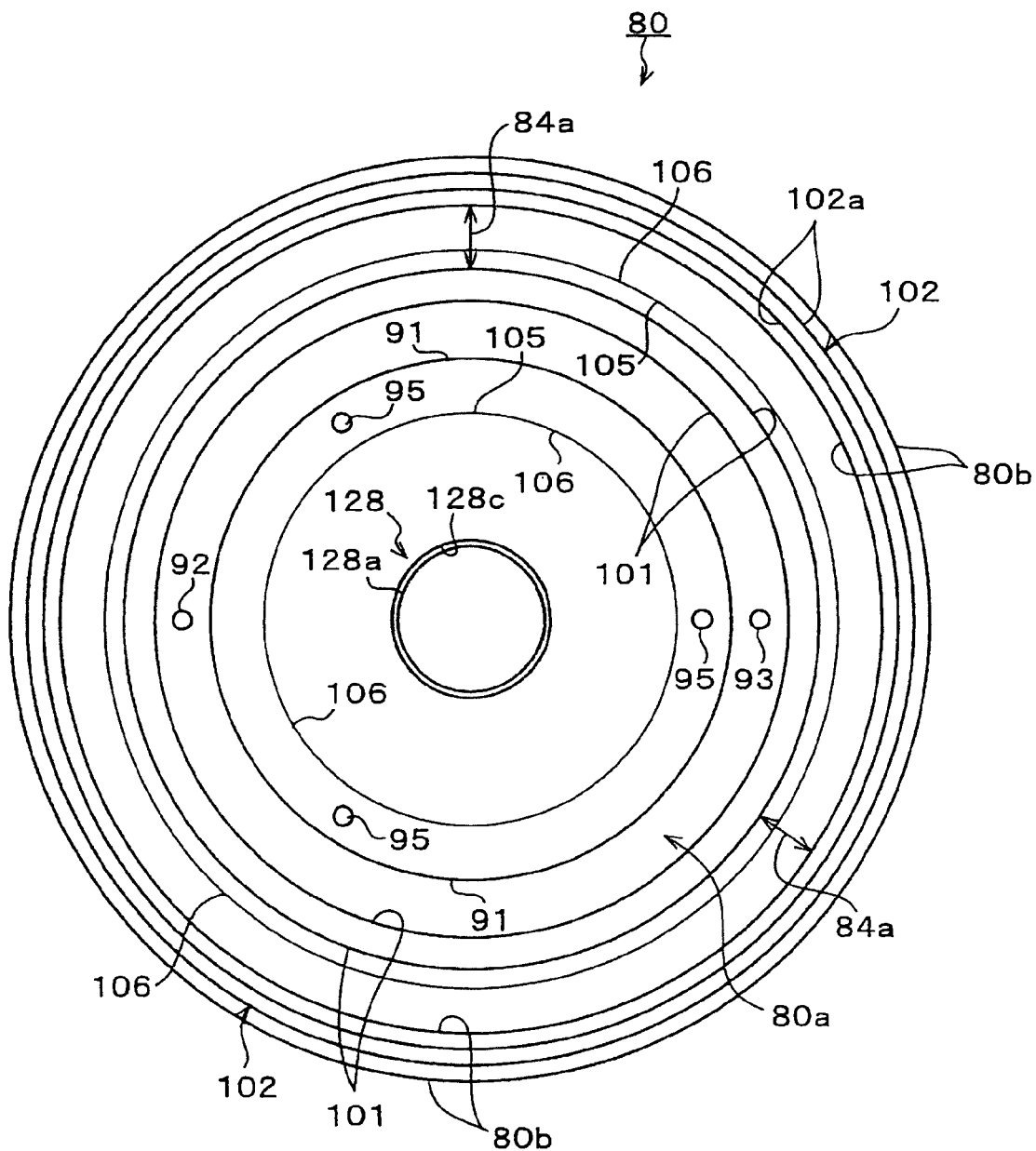
FIG. 6 is a plan view of a vessel body.
Figure 7:
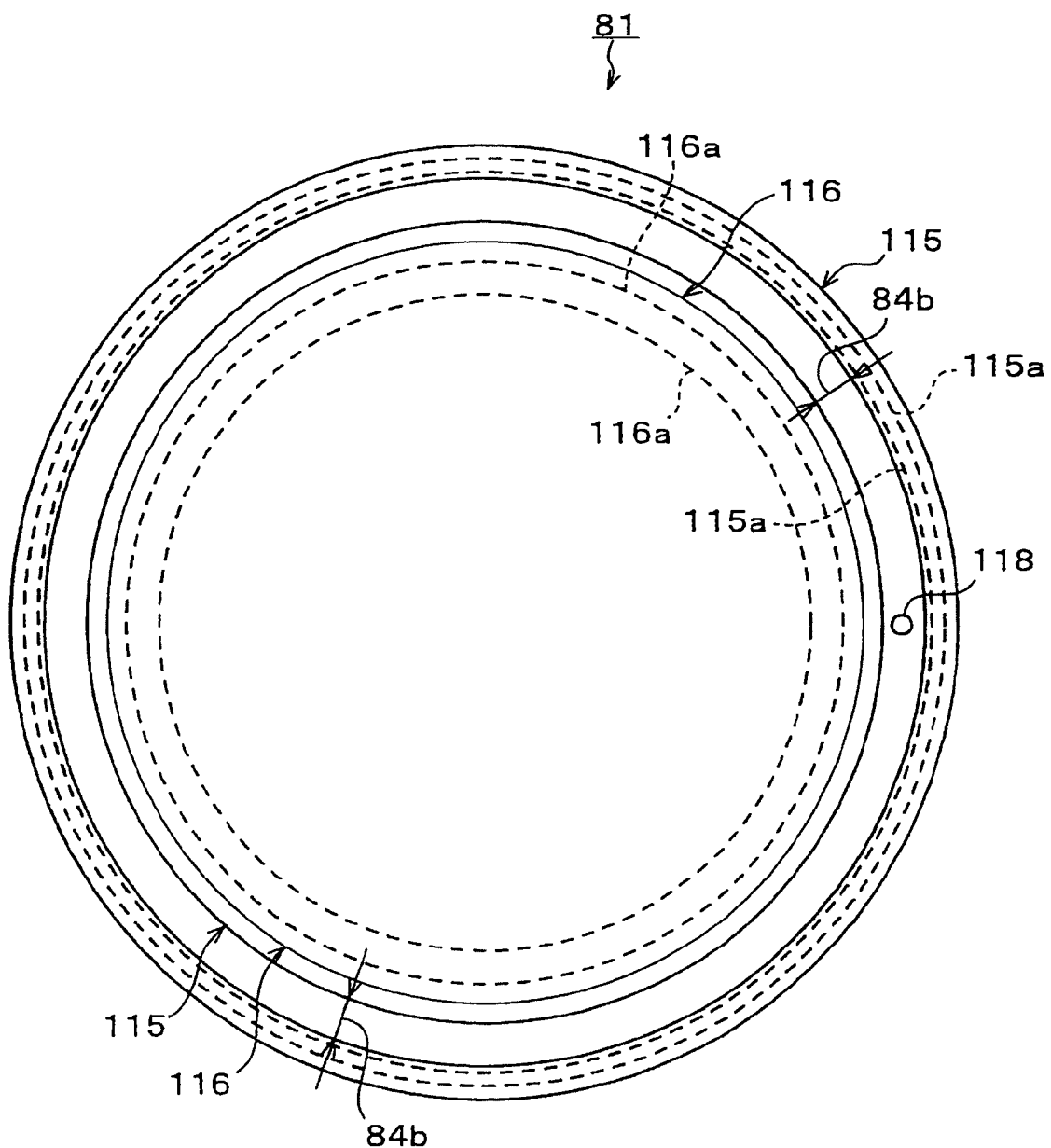
FIG. 7 is a bottom view of the lid.

The processing vessel 30 will be described. FIG. 4 is a schematic longitudinal sectional view of the processing vessel 30. In FIG. 4, the open end 80a of a vessel body 80 is covered with a lid 81. FIG. 5 shows the processing vessel 30 in a state where the lid 81 is separated from the open end 80a. FIG. 6 is a top view of the vessel body 80 of the processing vessel 30. FIG. 7 is a bottom view of the lid 81 of the processing vessel 30.

Referring to FIGS. 4 and 5, the processing vessel 30 has the vessel body 80 having the shape of a hollow cylinder having an open top end and a bottomed bottom end, and the lid 81 having the shape of a disk and covering the open upper end of the vessel body 80 from above. A processing space 83 in which a wafer W is processed is formed by covering the open upper end of the vessel body 80 with the lid 81. A low-pressure space 84 is defined between respective peripheral part of the vessel body 80 and the lid 81. Pressure in the low-pressure space 84 is reduced to a pressure below that in the processing space 83 to bring the lid 81 into close contact with the vessel body 80. A lid moving mechanism 86 is disposed above the processing vessel 30 to move the lid 81 vertically relative to the vessel body 80.

A stage 91 for supporting a wafer W in a substantially horizontal position thereon in the vessel body 80 is disposed on the bottom of the vessel body 80. A process fluid supply port 92 through which process fluids, namely, ozone and steam, are supplied into the processing space 83, and a discharge port 93 through which the process fluids are discharged from the processing space 83 are formed in diametrically opposite parts, respectively, of the stage 91. A purging gas, such as $N_2$ (nitrogen gas) can be supplied through the process fluid supply port 92 into the processing space 83 and $N_2$ can be discharged through the discharge port 93 from the processing space 83.

The respective downstream ends of the ozone supply line 51 and the steam supply line 71 are connected to the process fluid supply port 92. A main discharge line 131 is connected to the discharge port 93.

Suction ports 95 for holding a wafer W by suction on the upper surface of the stage 91 are opened in the upper surface of the stage 91. The suction ports 95 are connected to a suction line 96 connected to a suction mechanism 97 provided with, for example, an ejector or the like outside the processing vessel 30. The suction mechanism 97 evacuates the suction line 96 and the suction ports 95 to attract a wafer W to the stage 91 by suction to hold the wafer W on the stage 91.

The vessel body 80 is provided with a double sealing structure surrounding the processing space 83 to seal the joint between the vessel body 80 and the lid 81. The double sealing structure includes a first sealing member 101 for sealing the joint between the vessel body 80 and the lid 81 to isolate the processing space 83 from the low-pressure space 84, and a second sealing member 102, surrounding the first sealing member 101, for sealing the joint between the vessel body 80 and the lid 81 to isolate the low-pressure space 84 (and the processing space 83) from a space surrounding the processing vessel 30.

The first sealing member 101 is disposed between the processing space 83 and the low-pressure space 84. The first sealing member 101 stands on a part of the bottom surface of the vessel body 80 on the inner side of a cylindrical side wall 80b of the vessel body 80 and on the outer side of the stage 91. The first sealing member 101 is a substantially circular ring extending along the inner surface of the side wall 80b so as to surround the stage 91 as shown in FIG. 6. The top surface of the first sealing member 101 is pressed closely against the lower surface of the lid 81, namely, a first sealing member contact surface 116a which will be described later. The processing space 83 is surrounded by the first sealing member 101. A space surrounding the first sealing member 101, namely, an annular space extending between the first sealing member 101 and the side wall 80b, is a lower groove 84a forming a lower part of the low-pressure space 84. Thus, the processing space 83 is separated from the lower groove 84a (the low-pressure space 84) by the first sealing member 101.

The first sealing member 101 is exposed directly to an atmosphere (the processing fluid) in the processing space 83 while a wafer W is being processed. Therefore, the first sealing member 101 is required to be made of a material excellent in corrosion resistance and heat resistance to the atmosphere in the processing chamber 83. Desirably, the first sealing member 101 is formed of a material having corrosion resistance and heat resistance higher than those of a material forming the second sealing member 102 not exposed directly to the atmosphere in the processing chamber 83. A suitable material for forming the first sealing member 101 is a fluorocarbon resin, such as a PTFE (polytetrafluoroethylene resin)

A first sealing member contact surface 116a, to be brought into contact with the first sealing member 101, of the lid 81 is a surface of a member of, for example, silicon (Si), silicon carbide (SiC), quartz or a metal coated with a fluorocarbon resin. That is, in this embodiment, the surface of a member of silicon carbide or silicon and a surface of a fluorocarbon resin film are brought into contact with each other to enable the first sealing member 101 to exhibit a sealing ability.

In this embodiment, a peripheral part of the bottom of the processing space 83 and parts around the process fluid supply port 92, the discharge port 93 and the suction ports 88, and a peripheral part of the stage 91, namely, a part exposed to the processing space 83 in a state where a wafer W is mounted on the stable 95 and to be directly exposed to the atmosphere in the processing space 83 during a process for processing the wafer W are made of the same material as the first sealing member 101 as well as the first sealing member 101. The first sealing member 101 has a part corresponding to the peripheral part of the bottom surface of the processing space 83, and the parts around the process fluid supply port 92, the discharge port 93 and the suction ports 88, and the peripheral part of the stage 91. The first sealing member 101 having those parts can be detachably put on the vessel body 80.

The vessel body 80 includes a base 105 made of a material having a high thermal conductivity, such as aluminum, and an attachment 106 detachably attached to the base 105. The attachment 106 is formed in the shape of a circular ring in a plane as shown in FIG. 6 and is disposed on the inner side of the side wall 80b of the vessel body 80. The attachment 106 is detachably fixed to the base 105 with fastening parts, not shown, such as bolts. The attachment 106 is made of a material excellent in corrosion resistance and heat resistance to the atmosphere in the processing space 83, such as PTFE. The first sealing member 101 is formed in the attachment 106. The process fluid supply port 92, the discharge port 93, and the suction ports 88 are formed in parts of the attachment 106 on the inner side of the first sealing member 101. The base 105 forms most part of the stage 91, namely, a part in contact with and coated with a wafer W mounted on the stage 95. The attachment 106 forms a peripheral part of the stage 91. Thus, the first sealing member 101, the process fluid supply port 92, the discharge port 93 the suction ports 88 and the peripheral part of the stage 91 can be simultaneously attached to and removed from the vessel body 80 by attaching the attachment 106 to and removing the same from the base 105. That is, the first sealing member 101 can be changed by changing the attachment 106. Since the first sealing member 101, the process fluid supply port 92, the discharge port 93, the suction ports 88 and the peripheral part of the stage 91 can be simultaneously changed, maintenance work can be simplified.

The second sealing member 102 is, for example, a lip packing having a lip 102a having the shape of an inverted truncated circular cone and protruding from the upper surface of the side wall 80b. The second sealing member 102 has the shape of a substantially circular ring in a plane as shown in FIG. 7 and extends along the upper surface of the side wall 80b of the vessel body 80.

As shown in FIG. 5, the lip 102a having the shape of an inverted truncated circular cone is inversely tapered upward from the upper surface of the side wall 80b toward a second sealing member contact surface 115a in a free state when the lid 81 is separated from the vessel body 80. The lip 102a is compressed between the vessel body 80 and the lid 81 so as to expand radially outward. That is, the lip 102a is elastically deformed against the resilience thereof the joint between the vessel body 80 and the lid 81 and is pressed closely against the second sealing member contact surface 115a.

Normally, the second sealing member 102 is not exposed directly to the atmosphere in the processing space 83. Therefore, the second sealing member 102 may be made of a material inferior to that of the first sealing member 101 in corrosion resistance to the atmosphere in the processing space 83. However, it is possible that the second sealing member 102 is exposed to the atmosphere in the processing space 83 when the first sealing member 101 leaks the atmosphere in the processing space 83. Therefore, it is desirable that the second sealing member 102 has a proper corrosion resistance. Preferably, the second sealing member 102 is made of an elastic material having flexibility higher than that of the material of the first sealing member 101. The second sealing member 102 of this embodiment is made of BAI-TON® (fluororubber).

The second sealing member contact surface 115a, to be brought into contact with the second sealing member 102 is an aluminum surface. In this embodiment, the aluminum part is brought into plane contact with the second sealing member 102 made of fluororubber to create a nonleaking union.

Since the second sealing member 102 is made of an elastically deformable material. the second sealing member 102 has a high sealing ability to seal the joint between the vessel body 80 and the lid 81 higher than that of the first sealing member 101. In other words, the closeness of contact between the second sealing member 102 and the second sealing member contact surface 115a of the lid 81 is higher than that of contact between the first sealing member 101 and the first sealing member contact surface 116a of the lid 81.

Figure 8:
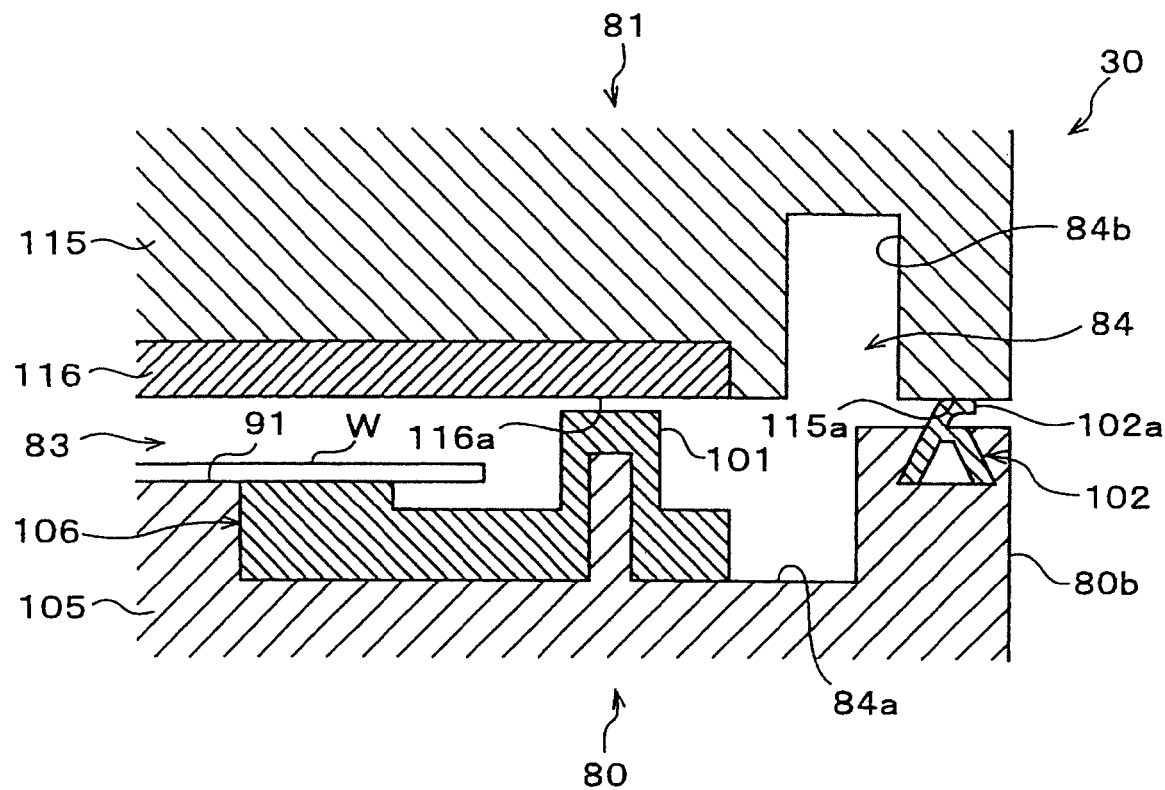
FIG. 8 is an enlarged, longitudinal sectional view of the processing vessel in an internal leakage state.

For example, whereas the upper surface of the first sealing member 101 is slightly separated from the lid 81, the deformed lip 102a tends to restore its original shape gradually by its resilience (restoring force) as the lid 81 is lifted up and remains in contact with the lid 81 when the lid 81 is lifted up slightly from the vessel body 80 as shown in FIG. 8. Even if a narrow gap is formed between the lid 81 and the first sealing member 101 to allow the processing space 83 to communicate with the low-pressure space 84, the second sealing member 102 does not permit leakage and keeps the processing space 83 and the low-pressure space 84 isolated from the external space outside the processing vessel 30 when the lid 81 is lifted up slightly. Thus, while the second sealing member 102 maintains a sealed state, only the first sealing member 101 can maintain an internal leakage state.

The lid 81 will be described. The lid 81 shown in FIGS. 4, 5 and 7 by way of example has a lid base 115 made of a material having high thermal conductivity, such as aluminum, and a lower plate 116 made of a material excellent in corrosion resistance and heat resistance to the atmosphere in the processing space 83, such as silicon (Si) or silicon carbide (SiC).

A peripheral part of the lower surface of the lower plate 116 is an annular, first sealing member contact surface 116a to be brought into contact with the first sealing member 101. A peripheral part of the lower surface of the lid base 115 extending on the outer side of the lower plate 116 is an annular second sealing member contact surface 115a to be brought into contact with the second sealing member 102.

An upper groove 84b forming an upper part of the low-pressure space 84 is formed between the first sealing member contact surface 116a and the second sealing member contact surface 115a. The lower groove 84a and the upper groove 84b are joined to define the low-pressure space 84 around the processing space 83.

A low-pressure space pressure regulating line 118 has one end connected to the upper groove 84b and the other end connected to a low-pressure space pressure regulating mechanism 120 capable of regulating the pressure in the low-pressure space 84 and disposed outside the processing vessel 30. The low-pressure space pressure regulating mechanism 120 is provided with, for example, an ejector or the like. The low-pressure space pressure regulating mechanism 120 can suck out the atmosphere in the upper groove 84b (the low-pressure space 84) to evacuate the low-pressure space 84. For example, the low-pressure space 84 can be set at a pressure $P_{L1}$ and the processing space 83 can be set at a pressure $P_{P1}$ such that $P_{L1} < P_0 < P_{P1}$, where $P_0$ is the pressure in the space outside the processing vessel 30, namely, the atmospheric pressure of about 101.3 kPa in this embodiment, in a normally sealed state where each of the first sealing member 101 and the second sealing member 102 is creating a nonleaking union.

The low-pressure space pressure regulating mechanism 120 is controlled to regulate the pressure $P_{L1}$ in the low-pressure space 84 in the normally sealed state such that pressure $P_{p2}$ in the processing space 83 in the internal leakage state is lower than the pressure $P_0$ in the space outside the processing vessel 30. The relation between the pressure $P_{P1}$ in the processing space 83 in the normally sealed state, the pressure $P_{L1}$ in the low-pressure space 84 in the normally sealed state, the pressure $P_{p2}$ in the processing space 83 in the internal leakage state, the pressure $P_{L2}$ in the low-pressure space 84 in the internal leakage state, the pressure $P_0$ in the space outside the processing vessel 30 (the external pressure), the volume $V_P$ of the processing space 83, and the volume $V_L$ of the low-pressure space 84 are expressed by Expression (1).

$$(P_{P1} \cdot V_P + P_{L1} * V_L)/(V_P + V_L) = P_{P2} = P_{L2} < P_0 \qquad (1)$$

Thus the pressure $P_{L1}$ in the low-pressure space 84 in the normally sealed state and the volume $V_L$ of the low-pressure space 84 are determined so that the pressure $P_{L2}$ in the low-pressure space 84 may be lower than the external pressure $P_0$ in the internal leakage state.

The pressure $P_{P2}$ in the processing space 83 in the internal leakage state may be lower when the volume $V_L$ of the low-pressure space 84 is larger. In other words, the larger the volume $V_L$ of the low-pressure space 84, the higher the pressure $P_{L1}$ in the low-pressure space 84 in the normally sealed state, so that load on the low-pressure space pressure regulating mechanism 120 can be reduced. Therefore, it is desirable that the low-pressure space 84 is formed in the largest possible volume $V_L$ within a range conforming to conditions for designing the processing vessel 30. For example, the volume $V_L$ may be larger than the volume $V_P$ of the processing space 83.

The lid 81 is held by the lid moving mechanism 86 disposed above the lid 81. The lid moving mechanism 86 is a cylinder mechanism including a cylinder 86a and a piston rod 86b as shown in FIG. 4 by way of example. The cylinder 86a is attached to a fixed frame 122 disposed above the lid 81 and fixed to the housing of the processing unit 23a or the like. The piston rod 86b projects from the lower end of the cylinder 86a with the longitudinal axis thereof extended in a vertical direction (the Z direction). The piston rod 86b moves vertically under the cylinder 86a. The lower end of the piston rod 86b is fixedly connected to a central part of the upper surface of the lid 81 (the lid base 115).

The lid 81 moves down together with the piston rod 86b toward the vessel body 80 when the piston rod 86b of the lid moving mechanism 86 is advanced down. The lid 81 moves up together with the piston rod 86b away from the vessel body 80 when the piston rod 86b is retracted. For example, the lid moving mechanism 86 retracts the piston rod 86b to lift up the lid 81 so that the open end 80a may be opened to open the processing space 83 when a wafer W needs to be carried into the processing vessel 30. In a state where the open end 80a is closed by the lid 81 and the processing space 83 is pressurized at a positive pressure, such as a state where a wafer W is being processed, the lid moving mechanism 86 can exert a pressure (thrust) capable of withstanding the positive pressure in the processing chamber 83 on the lid 81. The lid 81 is pressed down from outside (from above) the processing vessel 30 to hold the lid 81 so that the open end 80a may not open and the first sealing member 101 and the second sealing member 102 may be surely in close contact with the first sealing member contact surface 116a and the second sealing member contact surface 115a, respectively.

The processing vessel 30 is provided with heaters 125 and 126 for regulating the temperature of the atmosphere in the processing space 83. The heaters 125 are attached to lower parts of the vessel body 80 (the base 105). The heaters 126 are embedded in the lid 81 (the lid base 115).

The processing vessel 30 is provided with a wafer lifting mechanism 128 for vertically moving a wafer W mounted on the stage 91. The wafer lifting mechanism 128 includes a lifting pin 128a that comes into contact with the lower surface of a wafer W to support the wafer W thereon, and a drive device 128b for vertically moving the lifting pin 128a relative to the stage 91. The lifting pin 128a is extended through a through hole 128c extending between the upper surface of the stage 91 and the lower surface of the vessel body 80. The gap between the lifting pin 128a and the through hole 128c is sealed by a sealing member 128d to prevent the leakage of the atmosphere in the processing space 83 through the through hole 128c outside the processing vessel 30. In this embodiment shown herein, the lifting pin 128a and the through hole 128c are disposed in a central part of the stage 91 (a part of the base 105). When a wafer W is supported on the lifting pin 128a, a central part of the lower surface of the wafer W is seated on the upper end of the lifting pin 128a. The drive device 128b is disposed below the vessel body 80.

As shown in FIG. 3, the main discharge line 131 connected to the discharge port 93 is provided with a selector valve 132, a pressure switch 133, a check valve 134, an air-operated valve 135 and a relief valve 136 arranged in that order. The downstream end of the main discharge line 131 is connected to a discharged gas processing device 137 provided with an ozone killer and such. The respective downstream ends of the bypass ozone line 52 and the bypass steam line 72 are connected to parts between the check valve 134 and the air-operated valve 135 of the main discharge line 131.

In this embodiment, a $N_2$ supply line 141 is connected to a part of the ozone supply line 51. The $N_2$ supply line 141 branches off from a main $N_2$ supply line 142 connected to a $N_2$ source disposed outside the processing system 1. The $N_2$ supply line 141 is provided with an air-operated valve 143 for controlling the flow of $N_2$ through the $N_2$ supply line 141.

A $N_2$ discharge line 145 is connected to the selector valve 132 placed in the main discharge line 131. The selector valve 132 is a three-way valve. The selector valve 132 can be selectively set in a state for discharging ozone and steam, namely, process fluids, discharged from the processing vessel 30 through the discharge port 93 through the main discharge line 131 or a state for discharging $N_2$, namely, a purging gas, discharged from the processing vessel 30 through the discharge port 93 through the $N_2$ discharge line 145.

Although the processing unit 23a has been described by way of example, the other processing units 23b to 23f are similar in construction to the processing unit 23a.

The functional components of the processing system 1 are connected to the control computer 19 (FIG. 1) for automatically controlling operations of the processing system 1 by signal lines. The functional components are all the components, capable of realizing predetermined process conditions, including, for example, the wafer carrying device 7 and the window opening and closing mechanisms 10 of the transfer block 3, main wafer carrying device 18 and the four cleaning units 12, 13, 14 and 15 of the processing block 2, the ozone generator 40 and the steam generator 41 of the process gas generating unit 24, the chemical solution storage unit 25, and the selector valves 50, 70 and 132, the lid moving mechanism 86, the low-pressure space pressure regulating mechanisms 120, and the heaters 125 and 126 of the processing units 23a to 23f. Typically, the control computer 19 is a general-purpose computer capable of exercising optional functions according to software.

As shown in FIG. 1, the control computer 19 has an arithmetic unit 19a provided with a CPU (central processing unit), an I/O unit 19b connected to the arithmetic unit 19a. and a recording medium 19c storing control software and inserted into the I/O unit. The recording medium 19c stores control software (programs) to be executed by the control computer 19 to make the processing system 1 carry out a substrate processing method, which will be described later. The control computer 19 executes the control software to make the functional components of the processing system 1 realize process conditions specified by predetermined process recipes, such as the temperature of the processing space 83, the pressure $P_{P1}$ in the processing space 83 and the pressure $P_{L1}$ in the low-pressure space 84.

The recording medium 19c may be either of a recording medium permanently placed in the control computer 19 and a recording medium capable of detachably loaded into a reader, not shown, included in the control computer 19 and storing data readable by the reader. In a most typical embodiment, the recording medium 19c is a hard disk drive storing control software installed therein by a serviceman of the maker of the processing system 1. In another embodiment, the recording medium 19c is a removable disk to which control software is written, such as a CD-ROM or A DVD-ROM. Data stored in the removable disk is read by an optical reader, not shown, included in the control computer 19. The recording medium 19c may be either of a RAM (random-access memory) and a ROM (read-only memory). In a word, the recording medium 19c may be any optional one of recording mediums known in the computer technical field. In a plant in which plural processing system 1 are installed, the software may be stored in a host computer for the general control of the respective control computers 19 of the processing systems 1. In such a case, the processing systems 1 are operated through communication lines by the host computer so as to carry out predetermined processes.

Processing steps for processing a wafer W by the thus constructed processing system 1 will be described. The transfer arm 11 takes out one wafer W at a time from a carrier C placed on the table 6 of the inlet-outlet port 4 and transfers the wafer W to the lower transfer unit 17. Then, the main carrying device 18 carries the wafer W from the transfer unit 17 to one of the processing units 23a to 23f. Each of the processing units 23a to 23f makes the resist coating a surface of the wafer W water-soluble. Then, the carrying arm 18a carries the wafer W to one of the cleaning units 12, 13, 14 and 15. Then, the wafer W is subjected to a cleaning process using pure water or such to remove the water-solubilized resist from the wafer W. Thus, the resist is removed from the wafer W. Each of the cleaning units 12, 13, 14 and 15 processes the wafer W by the cleaning process, processes the wafer W by a contaminant removing process using a chemical solution to remove particles and metals from the wafer W as the occasion demands, and then dries the wafer W by a drying process. Then, the carrying arm 18a carries the wafer W to the upper transfer unit 16. Then, the transfer arm 11 transfers the wafer W from which the resist has been removed from the transfer unit 16 to the carrier C to place the wafer W in the carrier C.

The operating mode of the processing unit 23a as a typical example of those of the processing units 23a to 23f will be described. The lid moving mechanism 86 lifts up the lid 81 of the processing vessel 30 so that the lid 81 is separated from the upper end of the vessel body 80 to open the processing space 83. The lifting pin 128a of the wafer lifting mechanism 128 is moved up so as to project upward from the stage 91 and the open end 80a. Then, the carrying arm 18a of the main wafer carrying device 18 carries a wafer W into a space between the lid 81 and the vessel body 80 and places the wafer W on the upper end surface of the lifting pin 128a. After the wafer W has been thus transferred to the lifting pin 128a, the carrying arm 18a is retracted from the space between the lid 81 and the vessel body 80, and then the lifting pin 128a is moved down. Thus, the wafer W is carried through the open end 80a into the vessel body 80 and is placed on the stage 91.

After the carrying arm 18a has been retracted, the lid moving mechanism 86 moves the lid 81 down toward the vessel body 80 to close the open end 80a with the lid 81. Thus, the first sealing member contact surface 116a and the second sealing member contact surface 115a are brought into close contact with the first sealing member 101 and the second sealing member 102, respectively. Consequently, the sealed processing space 83 is formed inside the first sealing member 101. The upper open end of the lower groove 84a formed in the vessel body 80, and the lower open end of the upper groove 84b formed in the lid 81 are joined, and the lower groove 84a and the upper groove 84b defines the low-pressure space 84 outside the sealed processing space 83. The low-pressure space 84 extends between the first sealing member 101 and the second sealing member 102 so as to surround the processing space 83. The low-pressure space 84 is sealed by the first sealing member 101 and the second sealing member 102. Thus the lower surface of the lid 81 is brought into close contact with the first sealing member 101 and the second sealing member 102 to create a double sealing structure. Thus, a normally sealed state is created.

After the wafer W has been placed on the stage 91, the suction mechanism 97 is actuated to attract the lower surface of the wafer W by the suction ports 95 to hold the wafer W on the stage 91. After the normally sealed state has been created, the low-pressure space pressure regulating mechanism 120 is actuated to evacuate the low-pressure space 84. The pressure in the low-pressure space 84 approximately equal to the external pressure $P_0$ in the space outside the processing vessel 30 is reduced to a pressure $P_{L1}$ lower than the external pressure $P_0$. Consequently, the lid 81 is pressed against the vessel body 80 by a force corresponding to the pressure difference between the external pressure $P_0$ and the pressure $P_{L1}$ in the low-pressure space 84.

The lid 81 is locked in place so that the open end 80a may not open by the pressure applied thereto by the lid moving mechanism 86, and the respective dead weights of the piston rod 86b and the lid 81. The force corresponding to the pressure difference between the external pressure $P_0$ and the pressure $P_{L1}$ in the low-pressure space 84 serves as an additional force for locking the lid 81 in place. Thus, the pressure difference ensures locking the lid 81 in place and the lid 81 is firmly held in close contact with the vessel body 80.

A desired pressure $P_{L1}$ in the low-pressure space 84 is determined such that the pressure $P_{P2}$ in the processing space 83 is lower than the external pressure $P_0$ in an internal leakage state, where the first sealing member 101 leaks, and the processing space 83 and the low-pressure space 84 are isolated from the space outside the processing vessel 30. Such a desired pressure $P_{L1}$ is, for example, meets the condition expressed by Expression (1). In this embodiment, the external pressure $P_0$ of Expression (1) is the atmospheric pressure, and the pressure $P_{P1}$ in the processing space 83 is a gage pressure in the range of about 50 to about 75 kPa. The pressure $P_{L1}$ in the low-pressure space 84 may be, for example, a gage pressure in the range of about −80 to −90 kPa.

After the sealed processing space 83 and the sealed low-pressure space 84 have been thus formed and the pressure in the low-pressure space 84 has been adjusted to the desired pressure, the heaters 125 and 126 are energized to heat the processing space 83 and the wafer W. The pressure in the processing space 83 is increased by operating the selector valve 50 so as to supply ozone generated by the ozone generator 40 through the ozone supply line 51 and the process fluid supply port 92 into the processing space 83 to carry out a heating and pressurizing step. On the other hand, the selector valve 70 is operated so as to discharge steam generated by the steam generator 41 through the bypass steam line 72 into the main discharge line 131. In the heating and pressurizing step, the air-operated valve 143 placed in the $N_2$ supply line 141 is closed to stop supplying $N_2$. The selector valve 132 placed in the main discharge line 131 is operated so as to discharge ozone discharged from the processing vessel 30 through the discharge port 93 through the main discharge line 131.

In the heating and pressurizing step, ozone discharged from the processing space 83 through the discharge port 93 is discharged through the main discharge line 131. Steam carried into the bypass steam line 72 is discharged into the main discharge line 131. Thus, a mixed gas of zone and steam is discharged outside through the air-operated valve 135, the relief valve 136 and the main discharge line 131. a specified limit pressure for the relief valve 136 is, for example, in the range of about 50 to about 75 kPa. The pressure $P_{P1}$, in the processing space 83 during the heating and pressurizing step is higher than the external pressure $P_0$ in the space outside the processing vessel 30 and is regulated at a gage pressure, for example, in the range of about 50 to about 75 kPa. The set pressure $P_{L1}$ in the low-pressure space 84 is a gage pressure, for example, in the range of about −80 to about −90 kPa.

The atmosphere in the processing space 83 is replaced by ozone, the processing space 83 and the wafer W are heated at a predetermined temperature, for example, in the range of about 100° C. to about 110° C. to complete the heating and pressurizing step.

Then, a processing step is executed to process the wafer W held in the processing space 83. While steam generated by the steam generator 41 is supplied through the steam supply line 71 into the processing space 83, ozone is supplied through the ozone supply line 51 into the processing space 83. The processing space 83 is maintained at a fixed processing temperature. The mixed gas of ozone and steam is applied as a process fluid to the wafer W to oxidize the resist coating the surface of the wafer W to carry out water-solubilizing process. The mixed gas of ozone and steam discharged from the processing space 83 through the discharge port 93 is discharged through the main discharge line 131.

During the processing step, the pressure $P_{P1}$ in the processing space 83 is regulated at a pressure approximately equal to, for example, the pressure for the heating and pressurizing step, namely, a gage pressure in the range of about 50 to about 75 kPa. The pressure in the low-pressure space 84 is maintained at the set pressure $P_{L1}$, namely, a gage pressure, for example, in the range of about −80 to about −90 kPa.

A purging step is carried out to replace the atmosphere in the processing space 83 by $N_2$ after the predetermined processing step has been completed. The selector valve 50 is set so as to stop delivering ozone generated by the ozone generator 40 to the processing space 83 and to deliver ozone to the bypass ozone line 52. The selector valve 70 is set so as to stop delivering steam generated by the steam generator to the processing space 83 and to deliver steam to the bypass steam line and to deliver steam to the bypass steam line 72.

In the purging step, the air-operated valve 143 placed in the $N_{23}$ supply line 141 is opened to supply $N_2$ through the ozone supply line 51 into the processing space 83. The selector valve 132 placed in the main discharge line 131 is set so as to discharge $N_2$ discharged from the processing space 83 through the discharge port 93 through the $N_2$ discharge line 145. Thus, in the purging step, $N_2$ is supplied into the processing space 83 to replace the atmosphere in the processing space 83 by $N_2$.

The wafer W is taken out from the processing space after the purging step has been completed. Suction through the suction ports 95 to attract the wafer W to the stage 91 is stopped. The pressure in the low-pressure space 84 is increased to, for example a pressure on the order of the external pressure $P_0$ by operating the low-pressure space pressure regulating mechanism 120. Subsequently, the lid moving mechanism 86 lifts up the lid 81 to separate the lid 81 from the upper end of the vessel body 80 and to open the processing space 83 and the low-pressure space 84. Then, the lifting pin 128a is moved up to raise the wafer W above the stage 91 and the open end 80a so that the wafer W can be carried out from the processing vessel 30. Then, the carrying arm 18a of the main wafer carrying device 18 is advanced into the space between the lid 81 and the vessel body 80 to receive the wafer W from the lifting pin 128a. Subsequently, the carrying arm 18a holding the wafer W is retracted from the space between the lid 81 and the vessel body 80 to carry out the wafer W from the processing vessel 30.

During execution of the heating and pressurizing step, the processing step and the purging step in the processing space 83, the processing space 83 is pressurized by ozone, steam and $N_2$ supplied into the processing space 83 at the pressure $P_{P1}$ higher than the external pressure $P_0$. For example, in the heating and pressurizing step and the processing step, the pressure $P_{P1}$ in the processing space 83 is maintained at a gage pressure in the range of about 50 to about 70 kPa. Therefore, the pressure difference between the external pressure $P_0$ and the pressure $P_{P1}$ in the processing space 83 acts on the lid 81 in a direction to separate the lid 81 from the vessel body 80. The lid 81 is locked in place so that the lid 81 cannot separate from the vessel body 80 by the pressure exerted thereon by the lid moving mechanism 86 and by the agency of the negative pressure in the low-pressure space 84. Even if the pressure exerted by the lid moving mechanism 86 on the lid decreases due to the malfunction of the processing unit 23a, the lid 81 can be kept locked in place because the pressure $P_{L1}$ in the low-pressure space 84 is lower than the external pressure $P_0$, namely, the pressure meeting the condition expressed by Expression (1), and the pressure $P_{P1}$ in the processing space 83.

If the pressure exerted by the lid moving mechanism 86 on the lid 81 drops, for example, due to the malfunction of the processing unit 23a, the lid 81 is lifted up from the vessel body 80 against the pressure of the lid moving mechanism 86 and the respective dead weights of the piston rod 86b and the lid 81 because the pressure $P_{P1}$ in the processing space 83 is higher than the external pressure $P_0$. Then, it is possible that first sealing member contact surface 116 separates from the first sealing member 101 to allow leakage. However, the shape of the lip 102a of the second sealing member 102 is changed by the resilience of the lip 102a so that the lip 102a may rise following the upward movement of the second sealing member contact surface 115a. Thus, the edge of the lip 102a remains in contact with the second sealing member contact surface 115a to exercise its sealing effect after the first sealing member contact surface 116a has separated from the first sealing member 101. Consequently, an internal leakage state where only the first sealing member 101 permits leakage is created.

In the internal leakage state, the low-pressure space 83 (and the processing space 83) is isolated from the external space outside the processing vessel 30 by the second sealing member 102, and the low-pressure space 84 communicates with the processing space 83 by means of the joint between the first sealing member 101 and the first sealing member contact surface 116a. Consequently, the atmosphere in the processing space 83 flows through the gap into the low-pressure space 84, the pressure in the processing space 83 drops and the pressure in the low-pressure space 83 rises. Since the pressure $P_{L1}$ in the low-pressure space 84 is adjusted to a sufficiently low pressure, an increase in the pressure in the low-pressure space 84 caused by the flow of the atmosphere in the processing space 83 into the low-pressure space 84 absorbed and the pressure in the low-pressure space 84 does not rise beyond the external pressure $P_0$. If the pressures respectively in the processing space 83 and the low-pressure space 84 are equalized due to the flow of the atmosphere in the processing space 83 into the low-pressure space 84 such that $P_{P2}=P_{L2}=(P_{P1} \cdot V_P +$ $P_{L1} \cdot V_L)/(V_P+V_L)$, The pressures $P_{P2}$ and $P_{L2}$ are lower than the external pressure, namely, $P_{P2}=P_{L2}<P_0$.

In the internal leakage state, the force acting on the lid 81 in a direction to separate the lid 81 from the vessel body 80 (to lift up the lid 81) is reduced, and a force acting to push the lid 81 toward the vessel body 80 (to lower the lid 81) is generated by the difference between the pressure $P_{P2}$ and the external pressure $P_0$ because $P_{P2}<p_0$. Thus the rise of the lid 81 beyond a position in the internal leakage state can be prevented. Thus the separation of the second sealing member contact surface 105a from the second sealing member 102, i.e., leakage through the joint sealed by the second sealing member 102, can be prevented.

Although the process carried out by the processing unit 23a has been described by way of example, the processing units 23b to 23f carry out a process similar to the foregoing process.

The separation of the lid 81 from the vessel body 80 can be prevented by adjusting the pressure $P_{L1}$ in the low-pressure space 84 in the normally sealed state such that the pressure $P_{P2}$ in the processing vessel 83 (the pressure $P_{L2}$ in the low-pressure space 84) in the internal leakage state is lower than the external pressure $P_0$; that is, leakage through the joint sealed by the second sealing member 102 can be prevented. Therefore, the second sealing member 102 can prevent the leakage of the corrosive atmosphere in the processing space 83 outside the processing vessel 30 can be prevented even if the first sealing member 101 permits leakage, which ensures safety.

The lid 81 can be surely held and can be prevented from opening by a simple mechanism including the low-pressure space 84, the low-pressure space pressure regulating line 118, and the low-pressure space pressure regulating mechanism 120 without using a complicated structure, such as a conventional locking mechanism. Such a structure does not require difficult adjustment required by a conventional locking mechanism and simplifies maintenance work. The structure is scarcely subject to malfunction and enhances reliability. A small number of parts are needed and the cost of the system can be reduced.

The present invention is not limited in its practical application to the embodiment specifically described herein. It is obvious to persons skilled in the art that many changes and modifications are possible in the foregoing embodiment under the category of the technical idea of the present invention, and it is to be understood that those changes and modifications are within the technical scope of the present invention.

For example, process gases other than ozone and steam may be supplied to the processing units. Processing units are not limited to the processing units 23a to 23f for carrying out the resist water-solubilizing process and may be processing units for processing workpieces by processes other than the resist water-solubilizing process. Workpieces are not limited to semiconductor wafers and may be substrates other than semiconductor wafers, such as glass substrates for LCDs, substrates for CDs, printed wiring boards and ceramic substrates.

The first sealing member 101 and the second sealing member 102 are attached to the vessel body 80, and the lid 81 has the first sealing member contact surface 116a and the second sealing member contact surface 115a in the foregoing embodiment. The arrangement of the sealing members 101 and 102 and the formation of those sealing member contact surfaces 116a and 115a are not limited to those specifically described herein. Either of or both the first and the second sealing member may be attached to the lid 81, and either of or both the first and the second bearing contact surface may be formed in the vessel body 80. The first and the second sealing member may be of any suitable type, material and shape other than those of the first and the second sealing member specifically described herein. For example, the first sealing member or the second sealing member may be an O ring.

The shapes of the processing space 83 and the low-pressure space 84 are not limited to those mentioned above. For example, Although the low-pressure space 84 of the foregoing embodiment is formed by joining the lower groove 84a formed in the vessel body 80 and the upper groove 84b formed in the lid 81, the low-pressure space may be formed in only the lower groove 84a or the upper groove 84b. The low-pressure space pressure regulating line 118 may be connected to the vessel body (80) (the lower groove 84a) instead of to the lid 81.

The low-pressure space pressure regulating mechanism 120 of the foregoing embodiment adjusts the pressure $P_{L1}$ in the low-pressure space 84 in the normally sealed state before the internal leakage state such that the pressure $P_{L1}$ is lower than the external pressure $P_0$. The pressure $P_{L1}$ in the low-pressure space 84 may be adjusted such that the pressure $=_{P2}$ in the processing space 83 (the pressure $P_{L2}$ in the low-pressure space 84) is approximately equal to the external pressure $P_0$, namely, $P_{P2}=P_{L2}=P_0$, in the internal leakage state. The pressure $P_{P2}$ ($P_{L2}$) may be equal to or not higher than the external pressure $P_0$, preferably, the pressure $P_{P2}$ ($P_{L2}$) may be lower than the external pressure $P_0$ as mentioned in the description of the embodiment. In other words, the pressure $P_{P2}$ ($P_{L2}$) may be determined so as to meet a condition expressed by Expression (1)', preferably, so as to meet a condition expressed by Expression (1).

$$(P_{P1} \cdot V_P + P_{L1} \cdot V_L)/(V_P+V_L) = P_{P2} = P_{L2} < P_0 \tag{1'}$$

The separation of the lid 81 from the vessel body 80 in the internal leakage state can be prevented and leakage through the second sealing member 102 can be prevented also when the pressure $P_{P2}$ in the processing space 83 is equal to the external pressure $P_0$ in the internal leakage state. The opening of the lid 81 can be prevented by a simple mechanism without using a complicated structure, such as the conventional locking mechanism.

INDUSTRIAL APPLICABILITY

The present invention is applicable to systems and method using gases for processing workpieces, such as semiconductor wafers and substrates for LCDs.

The invention claimed is:

1. A processing method of processing a workpiece comprising the steps of:
   placing the workpiece in a processing system comprising: a processing vessel having a vessel body defining a processing space for receiving the workpiece and processing the same therein, and a lid for covering an opening formed in the vessel body to seal the processing space, the processing space being surrounded by a low-pressure space setable at a pressure lower than that of the processing space; a first sealing member sealing a joint between a part of the vessel body and a part of the lid to separate the low-pressure space from the processing space; and a second sealing member sealing a joint between a part of the vessel body and a part of the lid on the outer side of the first sealing member to separate the low-pressure space from an external space surrounding the processing vessel, the second sealing member being a resilient lip sealing member, by carrying the workpiece through the opening;

covering the opening by the lid of the processing vessel to close the processing space, and creating a normally sealed state where the external space surrounding the processing vessel, the low-pressure space, and the processing space are isolated from each other with each having its own pressure;

evacuating the low-pressure space to a pressure such that when the processing space and the low-pressure space communicate with each other due to an internal leakage state, the pressure in the processing vessel is not higher than the pressure in the external space; and processing the workpiece placed in the processing space.

2. The processing method according to claim 1, wherein the workpiece placed in the processing space is processed with the pressure in the low-pressure space adjusted such that the pressure in the processing space is lower than the pressure in a space outside the processing vessel in the internal leakage state.

3. The processing method according to claim 1, wherein the workpiece placed in the processing space is processed after adjusting the pressure in the processing space to a pressure higher than the pressure in the space outside the processing vessel in the normally sealed state.

4. The processing method according to claim 1, wherein the workpiece placed in the processing space is processed with the lid covering the opening pressed against the vessel body.

5. The processing method according to claim 1, wherein the workpiece placed in the processing space is processed by using ozone, steam or a mixed fluid of ozone and steam supplied into the processing space.

6. A processing method of processing a workpiece comprising the steps of:

placing the workpiece in a processing system comprising: a processing vessel having a vessel body defining a processing space for receiving the workpiece and processing the same therein, and a lid for covering an opening formed in the vessel body to seal the processing space, the processing space being surrounded by a low-pressure space that is settable at a pressure lower than that of the processing space and that has a volume not smaller than that of the processing space; a first sealing member sealing a joint between a part of the vessel body and a part of the lid to separate the low-pressure space from the processing space; and a second sealing member sealing a joint between a part of the vessel body and a part of the lid on the outer side of the first sealing member to separate the low-pressure space from an external space surrounding the processing vessel, by carrying the workpiece through the opening;

covering the opening by the lid of the processing vessel to close the process space, and creating a normally sealed state where the external space surrounding the processing vessel, the low-pressure space and the processing space are isolated from each other with each having its own pressure;

evacuating the low-pressure space to a pressure such that when the processing space and the low-pressure space communicate with each other due to an internal leakage state, the pressure in the processing vessel is not higher than the pressure in the external space; and processing the workpiece placed in the processing space.

* * * * *